United States Patent [19]

Hynecek et al.

[11] 4,309,624
[45] Jan. 5, 1982

[54] FLOATING GATE AMPLIFIER METHOD OF OPERATION FOR NOISE MINIMIZATION IN CHARGE COUPLED DEVICES

[75] Inventors: Jaroslav Hynecek, Dallas; Charles G. Roberts, Plano, both of Tex.

[73] Assignee: Texas Instruments Incorporated, Dallas, Tex.

[21] Appl. No.: 54,758

[22] Filed: Jul. 3, 1979

[51] Int. Cl.³ .................... G11C 19/28; H01L 29/78
[52] U.S. Cl. .................................. 307/221 D; 357/24
[58] Field of Search ...................... 357/24; 307/221 D

[56] References Cited

U.S. PATENT DOCUMENTS

| 3,758,794 | 9/1973 | Kosonocky | 357/24 |
| 4,090,095 | 5/1978 | Herrmann | 357/24 |
| 4,104,543 | 8/1978 | Maeding | 357/24 |

OTHER PUBLICATIONS

Wen "Design and Operation of a Floating Gate Amplifier" IEEE J. Solid-State Circuits, vol. SC-9 (12/74) pp. 410-414.

*Primary Examiner*—Gene M. Munson
*Attorney, Agent, or Firm*—William E. Hiller; Melvin Sharp; James T. Comfort

[57] ABSTRACT

The present invention is embodied in a method of operating a charge-coupled device (CCD) having a nondestructive readout floating gate amplifier to minimize noise on the floating gate. A pair of control gates are adjacent to and partially overlap the floating gate and are electrically insulated therefrom. Noise caused by presetting the floating gate voltage is minimized by presetting after a series of "reads" instead of after each "read". Coherent clock noise induced by capacitive coupling of the control gates to the floating gate is eliminated by applying appropriate simultaneous signals to the control gates. Device sensitivity is improved.

3 Claims, 10 Drawing Figures

4,309,624

FLOATING GATE AMPLIFIER METHOD OF OPERATION FOR NOISE MINIMIZATION IN CHARGE COUPLED DEVICES

BACKGROUND OF THE INVENTION

This invention is directed to charge-coupled devices, and more particularly, to a method of operating a charge-coupled device having a floating gate amplifier at the output.

Low noise detection and amplification of the signals represented by charge packets in charge-coupled devices (CCD's) are required so that CCD's may be used for low light level or other small signal applications. A non-destructive readout is also desirable to allow further processing of the signal after it is detected. The typical amplifier for detection of charge packets is the precharge amplifier in which a P-N junction is charged to a preset level through an MOS transistor and the signal charge is subsequently allowed to discharge the diode capacitance, thus producing a voltage difference proportional to the signal charge. Unfortunately, the precharge amplifier destroys the charge packet so that it cannot be further processed and produces a noise voltage proportional to $\sqrt{kT/c}$ due to thermal noise in the MOS transistor channel. A floating gate amplifier which provides a non-destructive readout has been described by Wen and Salsbury, "Analysis and Design of a Single Stage Floating Gate Amplifier", *ISSCC Dig. Tech. Papers*, February 1973, pp. 154-155 and Wen, "Design and Operation of a Floating Gate Amplifier", *IEEE Journal of Solid-State Circuits*, Vol. SC-9, No. 6, December 1974, pp. 410-414. This device also eliminates the preset noise inherent in the preset amplifier. Its structure is such that the floating gate is embedded in an oxide layer underneath a larger bias gate which is used to transfer charge beneath the floating gate. The clocking of the bias gate to transfer charge packets introduces noise on the floating gate, and stresses the insulating oxide because of the large voltages impressed. An improved version of a capacitively coupled floating gate amplifier is disclosed in a copending application, "Capacitively Coupled Floating Gate Amplifier", by Joseph E. Hall, Ser. No. 21,058, filed Mar. 16, 1979. This improved version remotely locates the bias gate and uses control gates to transfer charge packets thereby improving device sensitivity and eliminating some of the noise on the floating gate. However, in all of these structures, there is no conductive connection to the floating gate. Control of the potential on the floating gate tends to be uncertain such that the potential exhibits a tendency to drift with time due to charge migration in the surrounding insulator. This drift changes the operating point of the amplifier and the CCD channel potential. A conductively coupled floating gate amplifier which gives excellent control of the floating gate potential is described in a copending application, "Floating Gate Amplifier Using Conductive Coupling For Charge Coupled Devices", by Charles G. Roberts and Joseph E. Hall, Ser. No. 45,466, filed June 4, 1979. This amplifier uses a reverse biased semi-conductor diode or an MOS transistor to couple the floating gate to a bias voltage. Although this amplifier gives excellent control of the floating gate potential, the clocking scheme used to transfer charge and set the voltage on the floating gate induces a significant amount of noise in the system and consequently reduces the sensitivity of the amplifier.

SUMMARY OF THE INVENTION

The present invention is embodied in the clocking scheme for a CCD having a floating gate amplifier which provides a non-destructive readout. The floating gate is conductively coupled through an MOS transistor to a bias voltage. A pair of control gates are adjacent to and partially overlap the floating gate and are electrically insulated therefrom. The noise on the floating gate caused when the floating gate is preset to a prescribed voltage is minimized by presetting only after a series of "reads" has been accomplished instead of each time a "read" has been made. Coherent clock noise induced by capacitive coupling of the control gates to the floating gate is eliminated by applying appropriate simultaneous signals to the control gates. The signals induce equal but opposite potentials on the floating gate thereby cancelling out the noise induced by each one. Device sensitivity is improved allowing the use of lower signal levels and simplification of noise eliminating electronics.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings wherein:

DETAILED DESCRIPTION OF THE DRAWINGS

Figure 1:
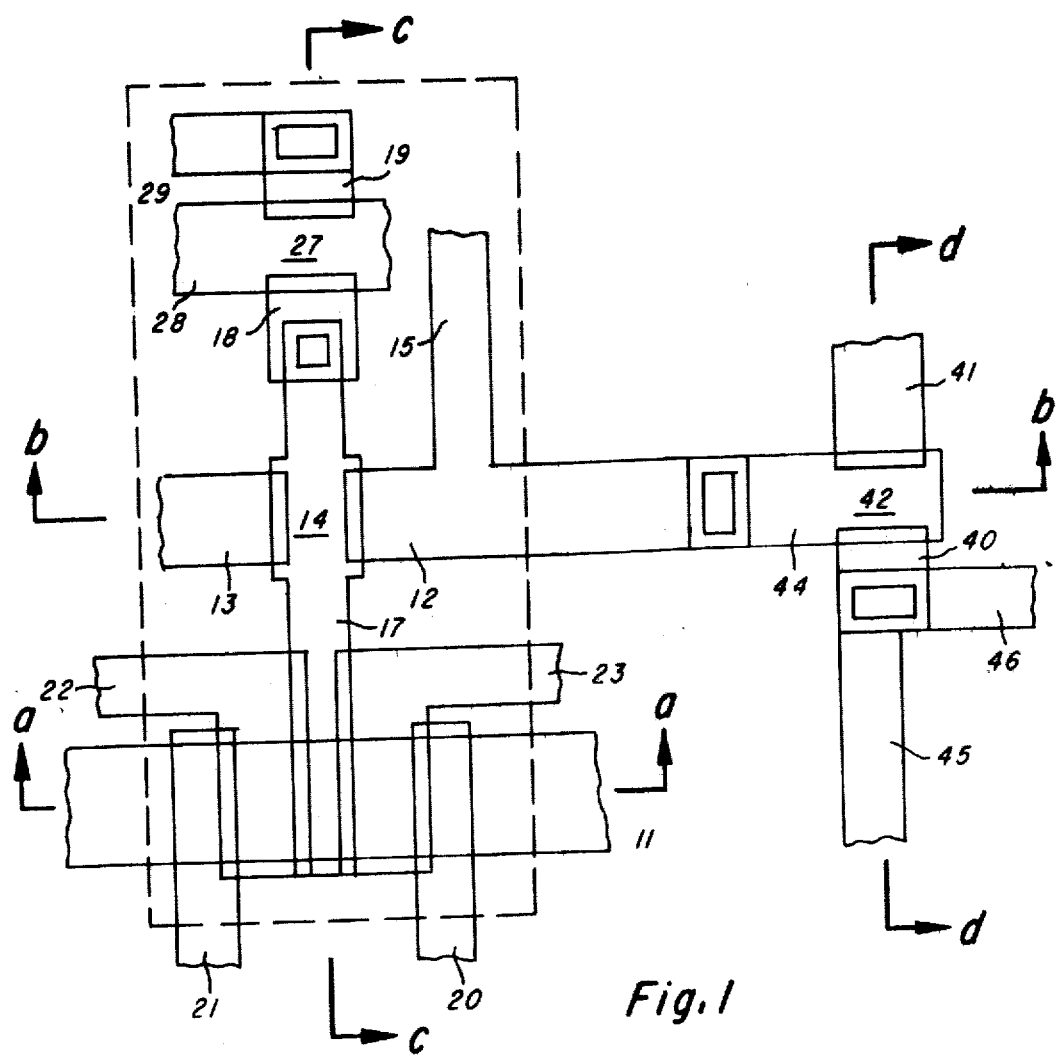
FIG. 1 is a greatly enlarged plan view of a small portion of a semiconductor chip showing the physical layout of a charge-coupled device floating gate amplifier.
Figure 2A:
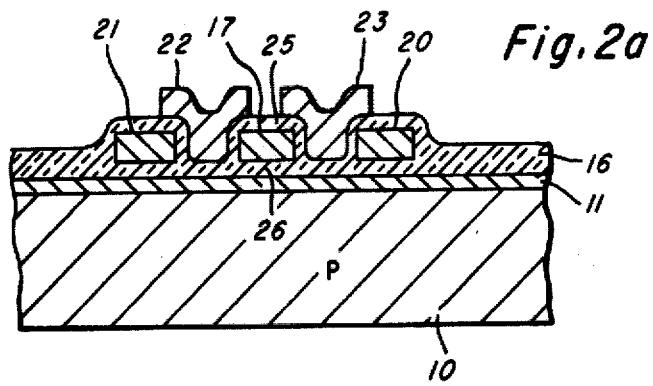
FIGS. 2a-2d are cross-sectional views of the amplifier of FIG. 1, taken along the lines a—a, b—b, c—c and d—d respectively.
Figure 2B:
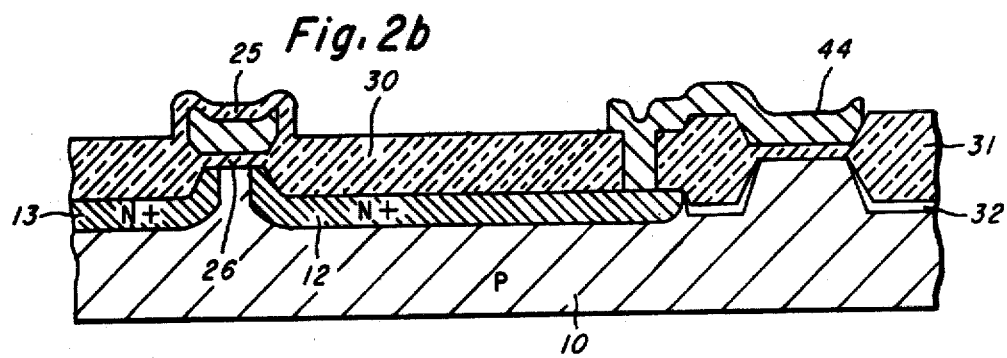
Figure 2C:
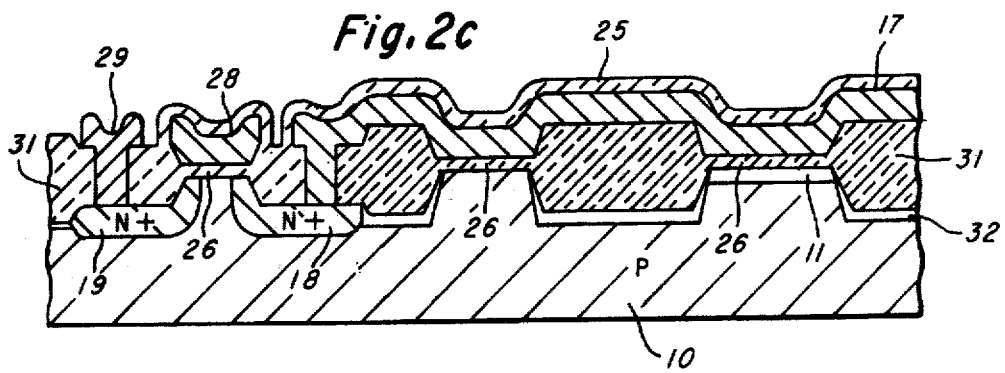
Figure 2D:
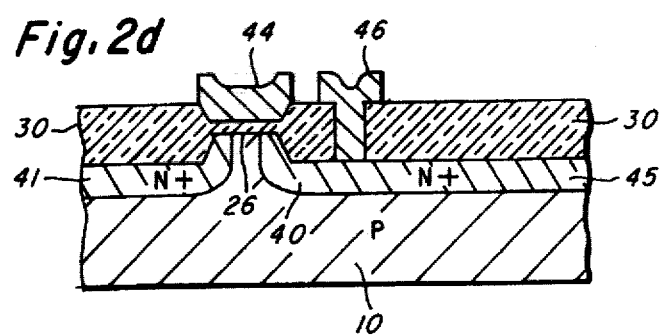

Referring to FIGS. 1 and 2a-2d, a floating gate amplifier at the output end of a charge-coupled device as constructed in accordance with the present invention is shown. The actual floating gate amplifier is contained within the dashed line of FIG. 1 with other output circuitry outside the line. The floating gate amplifier is formed in a substrate 10 of semiconductor material of one conductivity type, preferably p-type silicon, although n-type silicon and other semiconductor materials may be used. A buried charge transfer channel 11 is formed in the substrate 10 by an implant of the other conductivity type and lies parallel to the semiconductor surface. A pair of diffused regions 12, 13 of a conductivity type opposite that of the substrate 10 are formed in the substrate 10 adjacent to the charge transfer channel 11 and form the source 12 and drain 13 of an output transistor 14. A load resistor 15 is provided in the substrate 10 and is part of the same diffused region 12 which is the source of the output transistor 14. A body 16 of insulating material, preferably silicon oxide, lies on the substrate surface above the charge transfer channel 11. It will be understood that in the fabrication process, the insulating body 16 will be formed in more than one process step. A member 17 of conductive material which may be termed a floating gate is embedded in the insulating body 16 and extends transversely across the channel 11. In a preferred embodiment, the conductive member 17 may be aluminum, and it will be understood that in that case part of the insulating body 16 may be anodized aluminum. Other materials such as polycrystalline silicon could be used however in place of aluminum. The floating gate 17 also forms the gate of the output transistor 14. A pair of conductive phase electrodes 20, 21 are embedded in the insulating body 16 on opposite sides of the floating gate and extend transversely across the channel 11. A pair of parallel spaced control gates 22, 23 of conductive material extending transversely across the channel 11 are disposed on the insulating body 16 and partially overlap the floating gate 17 and the phase electrodes 20, 21. A pair of diffused regions 18, 19 of a conductivity type opposite that of the substrate 10 are formed in the substrate 10 remote from the charge transfer channel 11 and form the source 18 and drain 19 of a floating gate bias transistor 27. The floating gate 17 is connected to the source of the floating gate bias transistor 27 via contact window in the oxide layer 30 above the source 18. A conductive member 28, preferably of aluminum, is embedded in the insulating layer 16 and forms the gate of the floating gate bias transistor 27. A bias line 29, preferably of aluminum, is connected to the drain 19 of the floating gate bias transistor 27 via a contact window in the oxide layer 30 above the drain 19. The conductive member 28 also serves as a control pulse line. A layer 30 of silicon oxide covers the sources 12, 18 and drains 13, 19 of the output transistor 14 and the floating gate bias transistor 27, and the load resistor 15. Thick field oxide regions 31 are provided above channel stops 32 of the same conductivity type as the substrate 10 so as to surround elements of the amplifier.

The source 12 of the output transistor 14 is the output of the floating gate amplifier and is connected to the gate 44 of a source follower transistor 42. The source 40 and drain 41 of a source follower transistor 42 are diffused regions of the same conductivity type as the diffused regions comprising the source and drain areas 12, 13 of the output transistor 14. A conductive strip 44, preferably of aluminum, is connected to the source of the output transistor 14 via a contact window in the oxide layer 30 above the source 12, and it also forms the gate 44 of the source follower transistor 42. The gate 44 overlies the lower part 26 of the insulating body 16 which forms the gate oxide 26 for all the transistors. Another load resistor 45 is provided in the substrate 10, the load resistor 45 being part of the same diffused region 40 which is the source of the source follower transistor 42. A conductive member 46, preferably aluminum, is connected to the source 40 of the source follower transistor 42 via a contact window in the oxide layer 30 above the source 40. The member 46 is formed of the same material and at the same time as the control gates 22, 23 and is the output from the output circuitry.

In fabricating the floating gate amplifier, it will be understood that suitable processing techniques well known in the semiconductor industry may be used.

Figure 3:
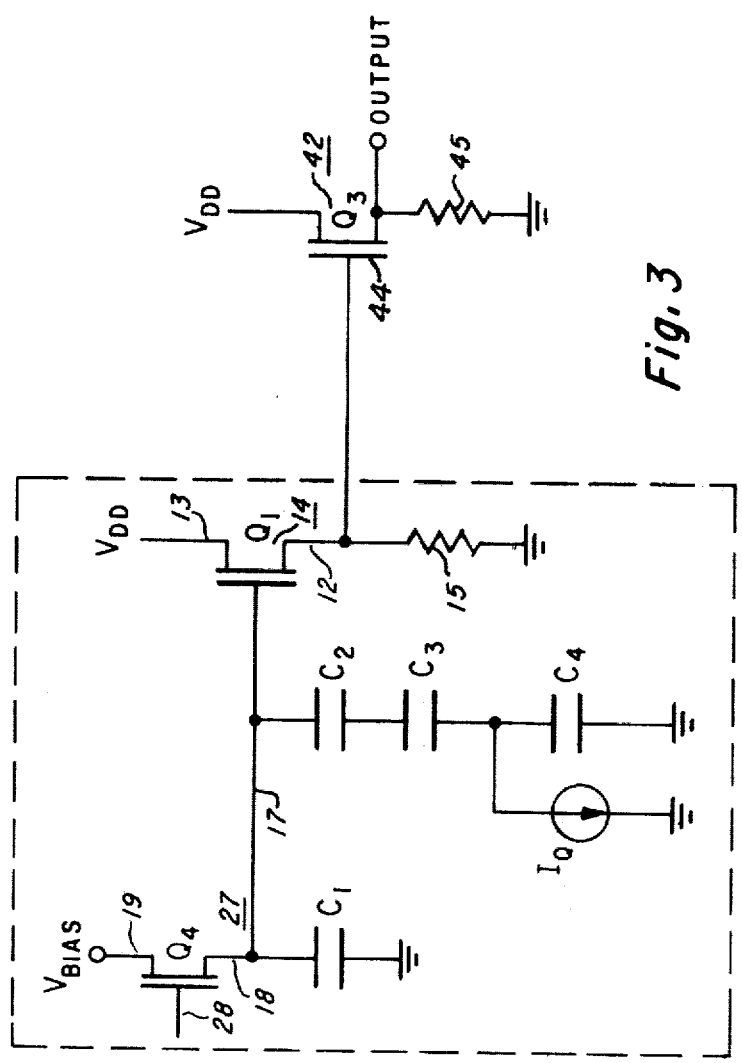
FIG. 3 is an electrical schematic of the floating gate amplifier of FIG. 1 and other output circuitry, the floating gate amplifier being shown within dotted lines.

FIG. 3 is an electrical schematic of the floating gate amplifier of FIG. 1 along with other output circuitry, the floating gate amplifier being shown within a dashed line rectangle. The floating gate amplifier comprises an MOS floating gate bias transistor 27, an MOS output transistor 14, a floating gate 17 and a load resistor 15. The floating gate bias transistor 27 has a drain 19 which is connected to a bias voltage, a source 18 which is connected to the floating gate 17 and a gate 28 which is the control pulse line 28. The output transistor 14 has a drain 13 connected to $V_{DD}$, a source 12 connected to a load resistor 15 and the gate 44 of the source follower transistor 42, and a gate 17 which is also the floating gate 17. In addition to the aforementioned elements, there are included within the amplifier schematic a current source $I_Q$ and a pluralilty of capacitors $C_1$, $C_2$, $C_3$, $C_4$. The current source $I_Q$ is representative of the movement of a charge packet into a potential well beneath the floating gate 17. Capacitor $C_1$ is representative of the stray capacitance between the floating gate 17 and ground. Capacitor $C_2$ is representative of the capacitance of the gate oxide between the floating gate and the silicon. Capacitor $C_3$ is representative of the capacitance of the depleted silicon region between the surface of the silicon and the charge in the well. Capacitor $C_4$ represents the capacitance between the charge in the potential well and the silicon bulk substrate for buried channel CCD's. These capacitances control the ability of the well to hold charge.

In a CCD device, information is stored in the storage wells of the device. To "read" what is stored in the wells, the charge in each well must be transferred to a location where it can be "read" and amplified. Here it is transferred to a storage well beneath the floating gate 17 which is an element in the floating gate amplifier. The floating gate amplifier is a non-destructive read-out amplifier such that the charge packet in the well is not destroyed when the information is read. It is the gate of the MOS output transistor 14, and it is connected to the source 18 of the floating gate bias transistor 27. The voltage on the floating gate is first set by turning on the floating gate bias transistor 27 by raising the voltage on the control pulse line 28 as shown in the CP waveform in FIG. 4 at 57. This raises the voltage on the floating gate 17 to $V_{preset}$, the voltage on the control pulse line 28 minus the threshold voltage of the floating gate bias transistor 27. Then, the voltage on the control pulse line 28 is lowered to turn off the floating gate bias transistor 27 as shown in the CP waveform in FIG. 4 at 58. This sets the voltage on the floating gate 17, sets that operating point of the output transistor 14, and prevents the floating gate bias transistor 27 from being turned on when a large charge packet is transferred beneath the floating gate 17. This also isolates the bias voltage from the floating gate 17 and the output transistor 14. When a charge packet is transferred into the storage well beneath the floating gate 17, it induces a voltage on the floating gate 17, temporarily changing the voltage that was just set. The voltage induced is proportional to the amount of charge in the charge packet. This induced voltage changes the current through the output transistor 14 and therefore can be detected and amplified. This operation can be demonstrated by referring to FIG. 3, the equivalent circuit of the floating gate amplifier. The current source $I_Q$ represents the amount of current in a charge packet that is transferred to the storage well beneath the floating gate 17. As such it is not continuous but only a pulse of current. The value of $I_Q$ will vary with the amount of charge in each charge packet. When current flows in $I_Q$, electrons are being placed in the capacitors $C_3$ and $C_4$ which causes a change in the voltage on the floating gate 17 when the charges are redistributed among the capacitors. This change in floating gate voltage changes the operating point of the output transistor 14 and changes the signal from the load resistor 15, the output of the floating gate amplifier. Since the floating gate amplifier output is proportional to the amount of charge in a charge packet, this mode of operation is useful for CCD imagers.

Figure 4:
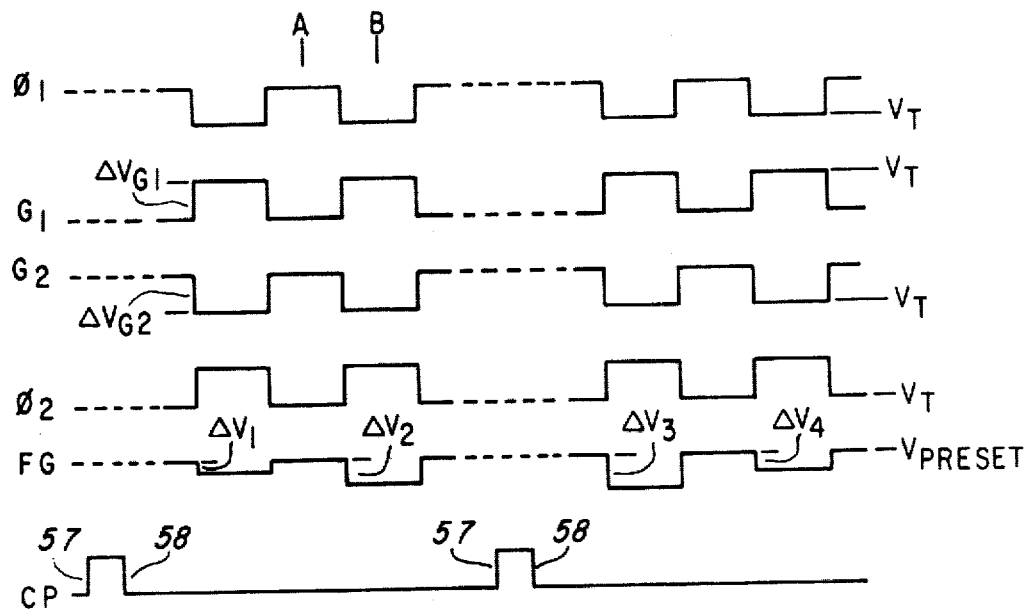
FIG. 4 is a diagrammatic view showing a clocking sequence for operation of the floating gate amplifier.
Figure 5A:
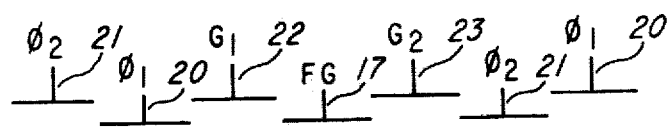
FIG. 5a is a diagrammatic view of the floating gate, control gates, and phase electrodes in the vicinity of the floating gate.
Figure 5B:
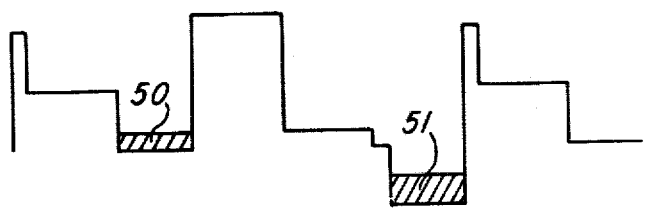
FIG. 5b and 5c are potential diagrams for the CCD of FIG. 5a at different points in time.
Figure 5C:
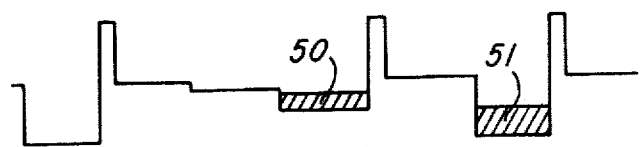

The operation of the floating gate amplifier in conjunction with the rest of the CCD can be understood by referring to FIGS. 4 and 5a–5c. FIG. 4 represents the voltages that are applied to or appear on some of the gates 17, 22, 23 and phase electrodes 20, 21 of FIG. 5a. FIGS. 5b and 5c show the potential beneath the gates 17, 22, 23 and phase electrodes 20, 21 of FIG. 5a at points in time "A" and "B" respectively in FIG. 4. These potentials correspond to the voltages applied to the gates 17, 22, 23 and phase electrodes 20, 21 at points in time "A" and "B" as seen in FIG. 4. Assume there is a charge packet 50 in a storage well beneath the $\phi_1$ phase electrode 20 which is to be "read". This charge packet 50 is represented by the cross-sectioned area beneath the $\phi_1$ phase electrode 20 in FIG. 5b. There is also a charge packet 51 under the $G_2$ control gate 23 which has already been "read". It also is represented by a cross-sectioned area. This point in time would be at "A" in FIG. 4 and the potentials beneath the gates 17, 22, 23 and phase electrodes 20, 21 of FIG. 5a would be as shown in FIG. 5b. To be "read" the charge packet 50 beneath the $\phi_1$ phase electrode must be transferred beneath the floating gate 17. Of course, at the point in time when this charge packet 50 is transferred beneath the floating gate 17, the charge packet 51 beneath the $G_2$ control gate 23 will be transferred beneath the $\phi_2$ phase electrode 21. Immediately after the transfer this point in time would be at "B" in FIG. 4 and the potentials beneath the gates 17, 22, 23 and phase electrodes 20, 21 of FIG. 5a would be as shown in FIG. 5c. The voltages on the $\phi_1$ and $\phi_2$ phase electrodes 20, 21 and on the $G_1$ and $G_2$ control gates 22, 23 must have changed from their values at "A" to their values at "B" to accomplish this charge transfer. $V_T$ is the voltage at which a potential well begins to form. The transfer of the charge packet will induce a voltage change on the floating gate 17 and the output voltage will change proportionally. This induced voltage can be seen in the changes $\Delta V_1$, $\Delta V_2$, $\Delta V_3$, $\Delta V_4$ in the FG waveform in FIG. 4. As stated earlier, the voltage changes $\Delta V_1$, $\Delta V_2$, $\Delta V_3$, $\Delta V_4$ will vary with each charge packet. After a series of "reads" is made, the voltage on the floating gate 17 is reset in the manner previously described. The resetting of the floating gate voltage after a series of "reads" instead of after "reading" each charge packet eliminates preset noise on the floating gate 17. The floating gate bias transistor 27 enables effective control over the floating gate potential to be achieved. The floating gate 17 is conductively coupled to the bias line 19 through the high resistance of the floating gate bias transistor 27 when it is in the "off" state. Consequently, the floating gate 17 stays at about a constant potential, $V_{preset}$, the voltage on the control pulse line 28 minus the threshold voltage of the floating gate bias transistor 27. The RC time constant determined by the capacitance of the floating gate 17 and the high resistance of the "off" state floating gate bias transistor 27 is so large that potentials can be induced on the floating gate 17.

It should be noted from FIG. 4 that the changes in the $\phi_1$ and $\phi_2$ phase electrodes and the control gates $G_1$ and $G_2$ occur simultaneously. This is one of the important features of the invention since this timing sequence is necessary to minimize the coherent clock noise caused by capacitance coupling of the control gates 22, 23 to the floating gate 17. The coherent clock noise is at a minimum when the capacitance ($C_{G1}$) on the $G_1$ control gate 22 times the signal ($\Delta V_{G1}$) on the $G_1$ control gate 22 equals the negative of the capacitance ($C_{G2}$) on the $G_2$ control gate 23 times the signal ($\Delta V_{G2}$) on the $G_2$ control gate 23. That is, when the following equation is satisfied:

$$C_{G1}\Delta V_{G1} = -C_{G2}\Delta V_{G2}$$

$\Delta V_{G1}$ and $\Delta V_{G2}$ are shown in FIG. 4. Since capacitance times voltage equals charge, the satisfaction of this equation will result in equal and opposite amounts of charge being induced on the floating gate 17 thereby giving no coherent clock noise on the floating gate 17. This is accomplished by simultaneously applying equal but opposite potentials to the control gates 22, 23 at time "A" as shown in FIG. 4. Of course, this equation could never be balanced unless the signals on the control gates 22, 23 were applied simultaneously. $C_{G1}$ and $C_{G2}$ are affected by the alignment of the mask levels and in most cases they will not be of equal value. Therefore, it may be necessary to adjust the amplitude and the offset of the signals on the control gates 22, 23 to accomplish this result. This should be kept in mind when examining these waveforms in FIG. 4.

There are several advantages to the clocking scheme of the present invention. The first is that resetting the voltage on the floating gate 17 after a series of "reads" instead of after each "read" eliminates a significant amount of preset noise that occurs each time the voltage on the floating gate 17 is reset. As stated earlier, having $C_{G1}\Delta V_{G1} = -C_{G2}\Delta V_{G2}$ eliminates coherent clock noise caused by the capacitance coupling of the control gates 22, 23 to the floating gate 17. The reduction in these noises gives greater device sensitivity and better resolution imagers.

While this invention has been described with reference to an illustrative embodiment, it is not intended that this description will be construed in a limiting sense. Various modifications of the illustrative embodiment, as well as other embodiments of the invention, will be apparent to persons skilled in the art upon reference to this description. It is therefore contemplated that the appended claims will cover any such modification of embodiments as fall within the true scope of the invention.

What is claimed is:

1. In a charge-coupled device having a floating gate electrode, control gate electrodes partially overlapping said floating gate electrode, and first and second sets of phase electrodes, a method of operating the charge-coupled device by transferring charge packets to obtain readout therefrom, said method comprising:

simultaneously imparting potentials to the control gate electrodes disposed on opposite sides of the floating gate electrode which are substantially equal voltages below and above a magnitude $V_T$, and at the same time, simultaneously imparting potentials to the first and second phase electrodes which are above and substantially equal to the magnitude $V_T$ respectively;

transferring charge packets through one transfer sequence by simultaneously changing the potentials of the control gate electrodes to be substantially equal to the magnitude $V_T$, and at the same time, simultaneously reversing the potentials imparted to the first and second phase electrodes such that the potentials are substantially equal to and above the magnitude $V_T$ respectively;

repeating the sequence of altering potentials imparted to the control gate electrodes and the first and second phase electrodes to successively advance such charge packets along the charge-coupled device; and successively reading the respective charge packets as they are disposed beneath the floating gate electrode.

2. A method as set forth in claim 1, further including resetting the potential on the floating gate electrode only after a plurality of charge packets have been successively transferred thereunder and read, whereby preset noise accompanying the resetting of the potential on the floating gate electrode is substantially reduced.

3. A method as set forth in claim 1, further including maintaining the relationship $C_{G1}\Delta V_{G1} = -C_{G2}\Delta V_{G2}$ between the control gate electrodes, where $C_{G1}$ is the capacitance and $\Delta V_{G1}$ is the signal on the first control gate electrode, and $C_{G2}$ is the capacitance and $\Delta V_{G2}$ is the signal on the second control gate electrode while the charge packet are being readout, whereby equal and opposite amounts of charge are induced on the floating gate electrode to minimize the occurrence of coherent clock noise thereon.

* * * * *